US005351096A

United States Patent [19]
Park

[11] Patent Number: 5,351,096
[45] Date of Patent: Sep. 27, 1994

[54] REMOTE CONTROL CIRCUIT FOR VIDEO CASSETTE TAPE RECORDER

[75] Inventor: Chung S. Park, Seoul, Rep. of Korea

[73] Assignee: Goldstar Co., Ltd., Seoul, Rep. of Korea

[21] Appl. No.: 857,829

[22] Filed: Mar. 26, 1992

[30] Foreign Application Priority Data

Mar. 27, 1991 [KR] Rep. of Korea ............ 4811/1991

[51] Int. Cl.$^5$ ............................................. H04N 5/44
[52] U.S. Cl. ................................. 348/734; 359/146
[58] Field of Search ................ 358/194.1; 340/825.69, 340/825.72; 455/151.2, 151.4, 153.2; 359/145, 142, 146, 148, 147; H04N 5/44, 5/40

[56] References Cited

U.S. PATENT DOCUMENTS

| 4,386,436 | 5/1983 | Kocher et al. | 358/194.1 |
|---|---|---|---|
| 4,527,204 | 7/1985 | Kozakai et al. | 358/194.1 |
| 4,817,203 | 3/1989 | Tsurumoto et al. | 359/148 |
| 5,081,534 | 1/1992 | Geiger et al. | 455/151.2 |
| 5,123,046 | 6/1992 | Levine | 359/146 |
| 5,151,789 | 9/1992 | Young | 358/194.1 |

Primary Examiner—Mark R. Powell
Assistant Examiner—Jeffrey S. Murrell

[57] ABSTRACT

A remote control circuit for a system wherein several terminal units are operatively connected to a single main unit, enabling the main unit to be controlled by the terminal units. The remote control circuit includes a remote control receiving unit equipped in a TV system and adapted to receive and process a remote control signal from a remote control transmitter, and a TV control microprocessor adapted to analyze the remote control receiving unit so as to output a VCR remote control signal and TV control signal based on code information of the remote control signal. The VCR control signal is transmitted to a VCR system by a VCR control signal transmitter, via a radio frequency cable. The VCR control signal includes a control signal converter and a pulse width modulator. In the VCR system, original VCR control signal is recovered, by a band-pass filter and a rectifier. The VCR control signal is converted into code information, by an A/D converter, which code information is applied to a VCR control microprocessor, so as to control the VCR system.

2 Claims, 5 Drawing Sheets

REMOTE CONTROL CIRCUIT FOR VIDEO CASSETTE TAPE RECORDER

BACKGROUND OF THE INVENTION

1. Field of the Invention

The present invention relates to a remote control circuit for a video cassette tape recorder, and more particularly to a remote control circuit for a video cassette tape recorder (VCR), which is capable of controlling a single VCR, to which several television receivers are connected in common, by utilizing a remote controller at either TV-side.

2. Description of the Prior Art

Referring to FIG. 1, which shows a general remote control circuit for a VCR, the remote control circuit comprises a remote control transmitter 10 for transmitting various key signals selected by the user, in the form of infrared ray signals, a remote control receiver 20 for receiving the infrared ray signal transmitted from the remote control transmitter 10 and decoding the infrared ray signal by a photoelectric conversion thereof, to generate a corresponding system drive signal, and a microprocessor 30 for receiving a system drive signal from the remote control receiver 20 and analyzing composed code information corresponding to the received system drive signal, to output a corresponding system drive control signal.

The remote control transmitter 10 includes a key matrix 11 adapted to generate various key signals selected by the user, a transmission-control microprocessor 12 adapted to scan a key signal from the key matrix 11 and output code information corresponding to the scanned key signal and an infrared ray transmitting unit 13 adapted to transmit the code information from the transmission-control microprocessor 12 to the remote control receiver 20, in the form of a near infrared ray signal. On the other hand, the remote control receiver 20 includes an infrared ray receiving unit 21 adapted to receive the infrared ray signal from the remote control transmitter 10 and convert it into an electric signal, an amplifying unit 22 adapted to amplify an output signal from the infrared ray receiving unit 21 to a predetermined level, a filtering unit 23 adapted to filter an output signal from the amplifying unit 22, a detecting unit 24 adapted to detect code information from an output signal from the filtering unit 24, and a wave-shaping unit 25 adapted to wave-shape an output signal from the detecting unit 24 and apply it to the microprocessor 30.

The operation of the conventional remote control circuit with the above-mentioned arrangement will now be described, in conjunction with FIGS. 2A to 2E.

When the user pushes a desired key on the key matrix 11, the transmission-control microprocessor 12 scans a key signal outputted from the key matrix 11 in response to the pushing of key and outputs code information corresponding to the key signal, as shown in FIG. 2A. By the code information signal from the transmission control microprocessor 12, a transistor Q1 of the infrared ray transmitting unit 13 is switched to turn on/off a light emitting diode PD1, thereby causing the infrared ray transmitting unit 13 to transmit a near infrared ray signal.

As the near infrared ray signal is transmitted from the remote control transmitter 10, by the above-mentioned procedure, it is received in a phototransistor PT1 of the infrared ray receiving unit 20, so that the phototransistor PT1 is turned on/off, to convert the received infrared ray signal into an electric signal shown in FIG. 2B. At this time, the signal outputted from the phototransistor PT1 has very weak intensity, as shown in FIG. 2B, and is thus amplified to an appropriate level, so that a signal as shown in FIG. 2C is outputted therefrom.

Thereafter, the output signal from the amplifying unit 22 is filtered in the filtering unit 23 and then is detected in the detecting unit 24 as a signal as shown in FIG. 2D. The detected signal is then wave-shaped into a signal having a waveform shown in FIG. 2E, in the wave-shaping unit 25, and then applied to the microprocessor 30 for controlling the overall system. The microprocessor 30 analyzes codes composed into the waveform shown in FIG. 2E and outputs a system control signal (CTL) indicative of the analyzed result. Accordingly, the operation of system can be controlled by key inputs from the remote control transmitter 10.

In case of such a conventional remote control system, however, one remote control transmitter can control only one appliance corresponding thereto. Where a TV system is connected to a VCR at a remote location from the VCR, or several TV systems disposed at different rooms are connected to one VCR, the VCR can not be controlled at the TV-side. As a result, in case of operating the VCR, the user should go to the position of VCR and then manipulate a remote control transmitter or control keys on VCR, thereby resulting in the troublesome operation.

SUMMARY OF THE INVENTION

Therefore, an object of the invention is to provide a remote control circuit for a VCR, being capable of controlling the one VCR, to which several TV systems are connected in common, by utilizing a remote controller at either TV-side.

In accordance with the present invention, this object can be accomplished by providing a remote control circuit for a VCR comprising: a remote control receiving unit adapted to receive and process a remote control signal from a remote control transmitter; a TV control microprocessor adapted to analyze the remote control receiving unit so as to control a TV system and separate a VCR remote control signal from the remote control signal; a VCR remote control signal transmitter adapted to modulate the pulse width of the VCR remote control signal separated in the TV control microprocessor and transmit the modulated VCR remote control signal to a VCR system, via a radio frequency cable; a remote control signal processing unit adapted to receive and process the VCR remote control signal from the TV system; and a VCR control microprocessor adapted to control the VCR system by the remote control signal inputted from the remote control signal processing unit and a control signal inputted from a remote control signal receiver equipped in the VCR.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
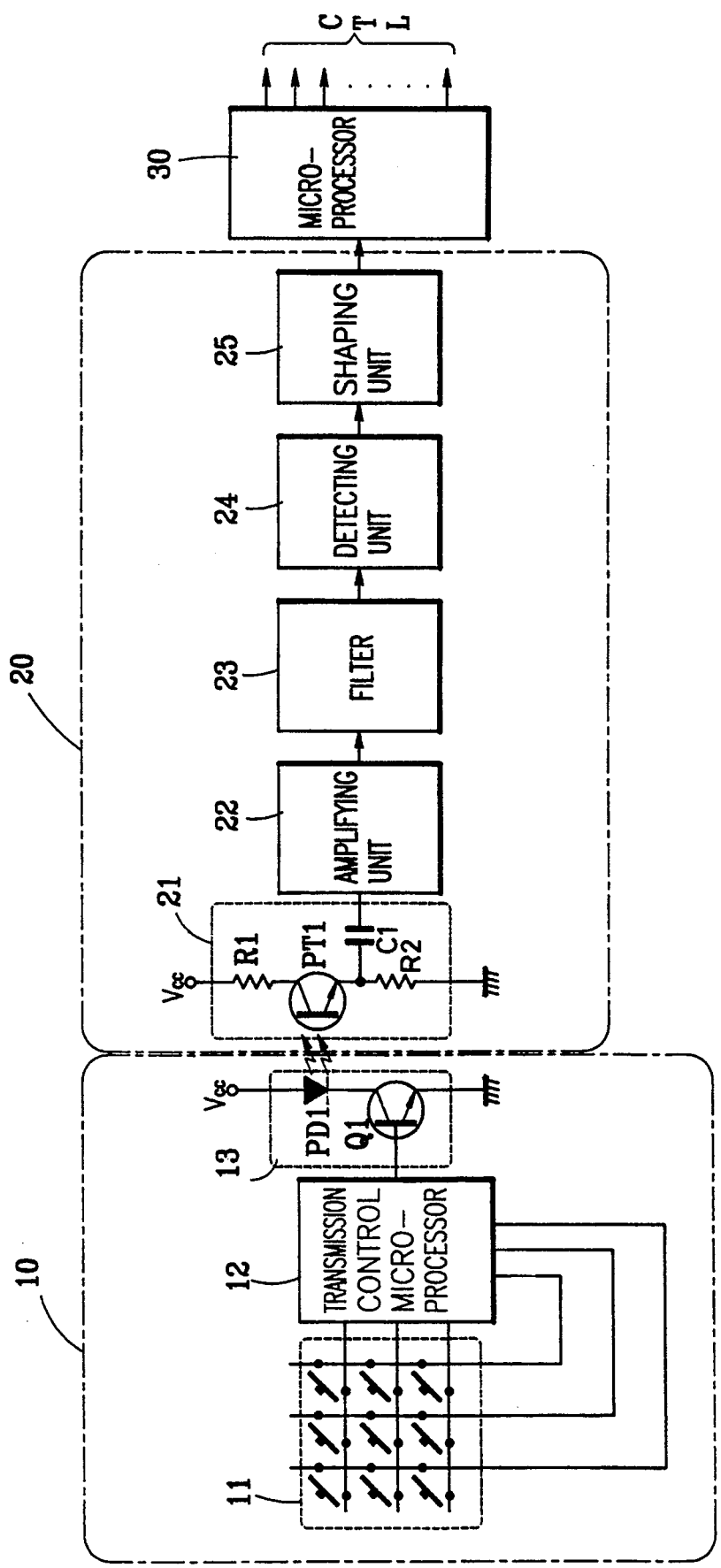
FIG. 1 is a circuit diagram of a conventional remote control circuit of a VCR.
Figure 2A:
FIGS. 2A to 2E are diagrams of waveforms of signals outputted from respective parts of the circuit of FIG. 1.
Figure 2B:
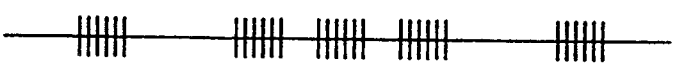
Figure 2C:
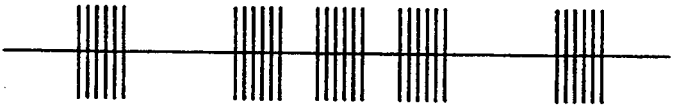
Figure 2D:
Figure 2E:
Figure 3:
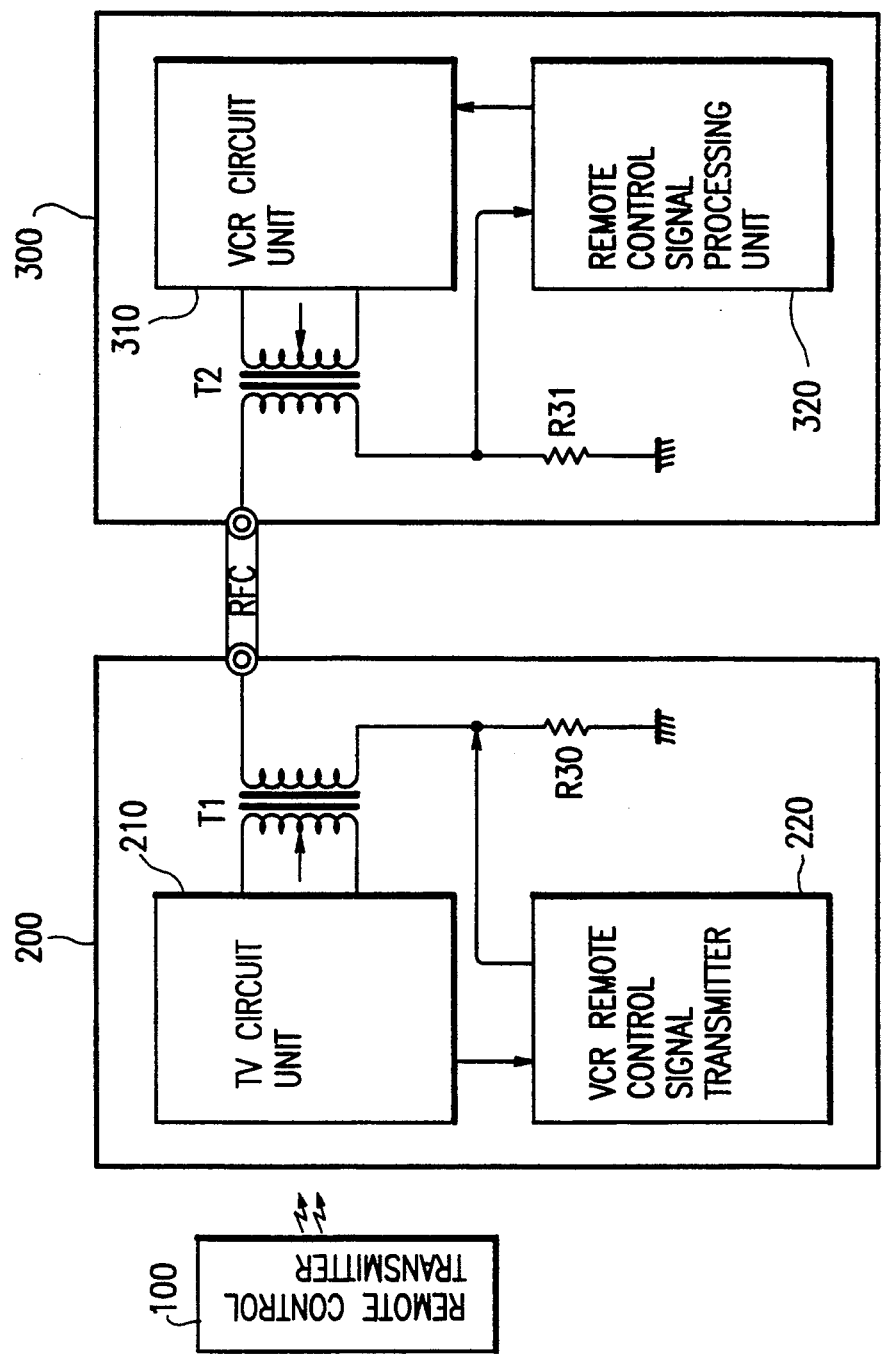
FIG. 3 is a block diagram of a remote control circuit of a VCR in accordance with the present invention.

Referring to FIG. 3, there is illustrated a remote control circuit for a VCR in accordance with the present invention. As shown in FIG. 3, the remote control circuit comprises a remote control transmitter 100, so as to remote-control a VCR 300 connected with a TV system 200. The remote control transmitter 100 is of a general type that can control both the TV system 200 and the VCR 300 in common. The TV system 200 includes a TV circuit unit 210 adapted to receive and decode an infrared ray remote control signal from the remote control transmitter 100, to control a TV driving system and separate a VCR remote control signal from the decoded remote control signal, and a VCR remote control signal transmitter 220 adapted to modulate the pulse width of the VCR remote control signal separated in the TV circuit unit 210 and transmit the modulated VCR remote control signal to the VCR 300.

On the other hand, the VCR 300 includes a remote control signal processing unit 320 adapted to receive and decode the modulated VCR remote control signal from the TV system 200, and a VCR circuit unit 310 adapted to receive the infrared remote control signal inputted from the remote control transmitter 100 to the VCR and control the VCR driving system, according to the received remote control signal. The VCR circuit unit 310 of the VCR 300 receives not only an infrared ray signal from a general remote control transmitter, to control the VCR driving system, but also the VCR remote control signal decoded by the remote control signal processing unit 320, to control the VCR driving system.

Herein, the path for transmitting the remote control signal from the TV system 200 to the VCR 300 is provided by a radio frequency cable RFC connecting the TV system 200 and the VCR 300 to transmit video signals therebetween. Generally, such a radio frequency cable is connected between the TV system 200 and the VCR 300 and adapted to transmit a video signal from the VCR 300 to the TV system 200. In accordance with the present invention, the radio frequency cable RFC is used as not only such a general path for transmitting video signals, but also the path for transmitting a VCR remote control signal from the TV system 200 to the VCR 300. Accordingly, there is no need for an additional cable or signal line required in remote controlling the VCR 300 at TV side.

Figure 4:
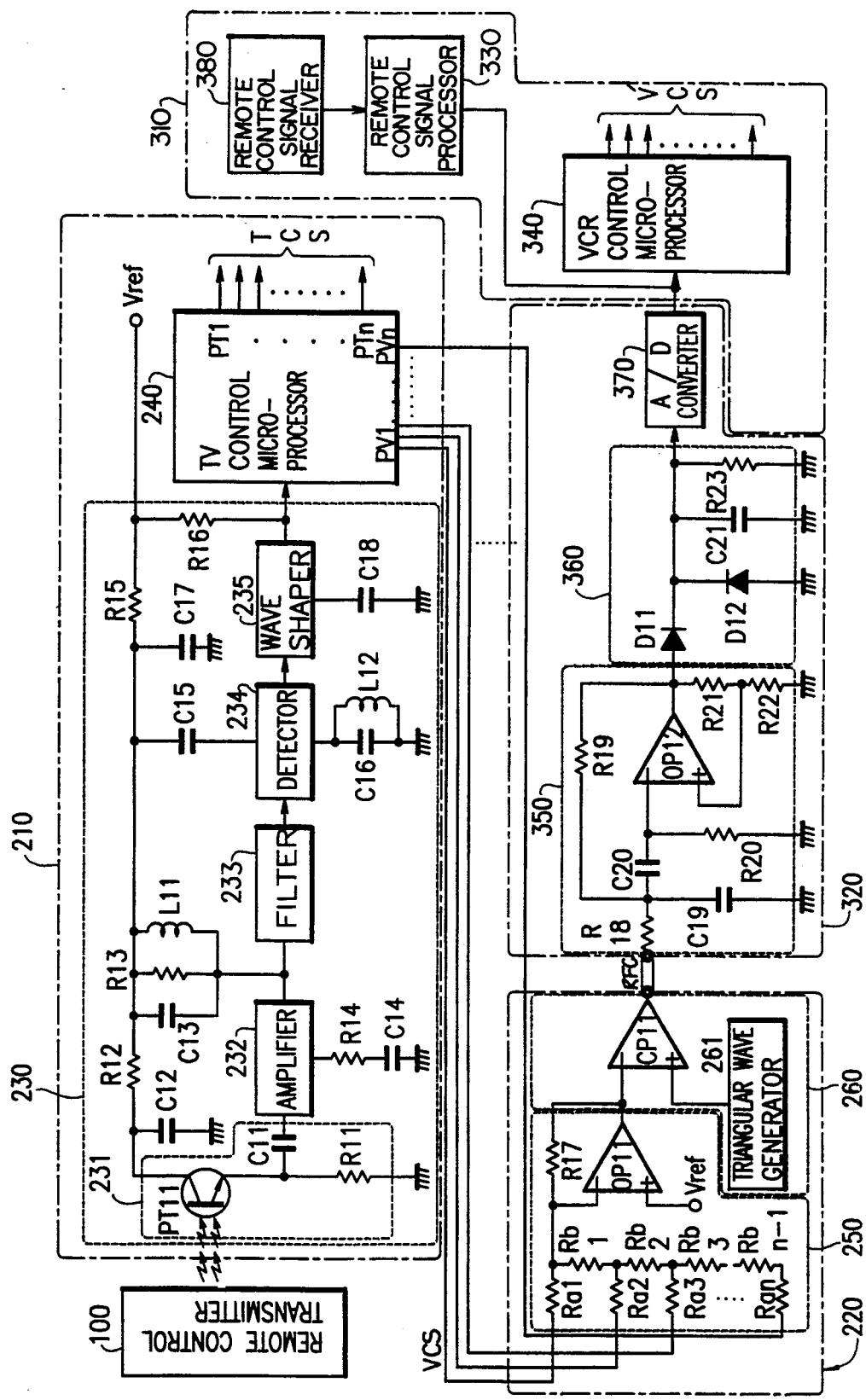
FIG. 4 is a detailed circuit diagram of the circuit shown in FIG. 3.

Referring to FIG. 4, there is shown a detailed circuit diagram of the remote control circuit for the VCR in accordance with the present invention. As shown in FIG. 4, the TV circuit unit 210 includes a remote control receiving unit 230 adapted to receive the infrared ray signal from the remote control transmitter 100 and photoelectrically converting it to detect an originally coded signal (remote control signal) and a TV control microprocessor 240 adapted to analyze the coded information from the remote control receiving unit 230 and outputting a TV control signal TCS and a VCR control signal VCS via different paths.

The remote control receiving unit 230 includes a remote control signal receiver 231 receiving an infrared ray remote control signal from the remote control transmitter 100 and converting it into an electric signal, the receiver including a phototransistor PT11, a condenser C11 and a resistor R11, an amplifier 232 for receiving the electric signal from the receiver 231 via the condenser C11 and amplifying it to a predetermined level, a filter 233 for removing noise from the amplified signal, a detector 234 for detecting an output from the filter 233 as a code information signal, and a wave shaper 235 for shaping a signal from the detector 234.

On the other hand, the VCR remote control signal transmitter 220 includes a control signal converting unit 250 adapted to convert the VCR control signal VCS from the TV control microprocessor 240 into a voltage level signal and a pulse width modulator 260 adapted to modulate the pulse width of an output signal from the control signal converting unit 250 and transmit the modulated signal to the VCR 300 via the radio frequency cable RFC. The control signal converting unit 250 includes a plurality of primary resistors Ra1 to Ran connected to output ports Pv1 to Pvn of the TV control microprocessor 240, respectively, and a plurality of secondary resistors Rb1 to Rbn-1 each connected between adjacent primary resistors, in parallel. With this arrangement, different combined resistances are established for respective output ports Pv1 to Pvn of the TV control microprocessor 240 at which the VCR control signal VCS with a constant voltage level is outputted. The control signal converting unit 250 also includes an operational amplifier OP11 having an inverting input for receiving the VCR control signal VCS from the TV control microprocessor 240 via primary resistors and/or secondary resistors and a non-inverting input for receiving a reference voltage Vref. Between the inverting input and output of the operational amplifier OP11, a resistor 17 is connected, so that the operational amplifier OP11 amplifies the voltage inputted at its inverting input, according to the voltage amplifying gain determined by each combined resistance and the resistance of the resistor R17.

The pulse width modulator 260 includes a triangular wave generator 261 and a comparator CP11 having a non-inverting input for receiving output from the operational amplifier OP11 and an inverting input for receiving output from the triangular wave generator 261.

The remote control signal processing unit 320 includes a band-pass filter 350 adapted to remove noise signal mixed in a radio frequency pulse width modulated signal received from the pulse width modulator 260 of the TV system 200 via the radio frequency cable RFC, a rectifier 360 adapted to rectify the pulse width modulated signal from the band-pass filter 350 and convert it into original VCR control signal VCS, and an A/D converter 370 adapted to convert VCR control signal VCS from the rectifier 360 into a digital remote control signal originally coded according to the level of the VCR control signal VCS. On the other hand, the VCR circuit unit 310 includes a VCR control microprocessor 340 adapted to analyze the code information from the A/D converter 370 and apply a VCR control signal VCS' to the VCR driving system, a remote control signal processor 330 adapted to process the signal directly received from the remote control transmitter and apply it to the VCR control microprocessor 340, and remote control signal receiver 380 for outputting a control signal to the remote control signal processor 330.

The band-pass filter 350 includes an operational amplifier OP12, resistors R18 to R22, and condensers C19 and C20. On the other hand, the rectifier 360 includes diodes D11 and D12, a condenser C21 and a resistor R23.

Now, the operation of the remote control circuit according to the present invention will be described, in conjunction with FIG. 4.

Figure 5A:
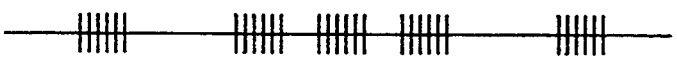
FIGS. 5A to 5I are diagrams of waveforms of signals outputted from respective parts of the circuit shown in FIG. 4.

As the user outputs a key signal for controlling the VCR 300, by using the remote control transmitter 100 around the TV system 200, the key signal is received in the remote control receiving unit 230 equipped in the TV system 200, so that the TV control microprocessor 240 generates a VCR control signal corresponding to the key signal. The VCR control signal is then modulated in the VCR control signal transmitter 220 and transmitted to the remote control signal processing unit 320 equipped in the VCR 300, via the radio frequency cable RFC. The remote control signal processing unit 320 processes the pulse width modulated signal and recovers the corresponding control signal. By the control signal, driving of the VCR is controlled. Herein, infrared ray signal from the remote control transmitter which is received in the VCR itself is processed by the remote control signal processor 330 of the VCR circuit unit 310.

Where the VCR 300 has to be controlled at the TV side, by using the remote control transmitter 100, the infrared ray signal from the remote control transmitter 100 is received in the phototransistor PT11 in which it is then converted into an electric signal. This electric signal is applied to the amplifier 232, via the condenser C11. The signal applied to the amplifier 232 has a code combination, for example, illustrated in FIG. 5A.

Figure 5B:
Figure 5C:
Figure 5D:

Therefore, the signal applied to the amplifier 232 is amplified to a predetermined level and converted into a signal with a level shown in FIG. 5B. The converted signal is supplied to the filter 233 to remove noise therefrom and then detected in the detector 234 as a code information signal. As a result, the detector 234 outputs a signal shown in FIG. 5C, which is then shaped by the wave shaper 235 which, in turn, outputs signals shown in FIG. 5D.

On the other hand, the TV control microprocessor 240 analyzes the code information received in the remote control receiving unit 230 and outputs a TV control signal TCS when the code information is one for controlling the TV system 200. Where the code information is one for controlling the VCR 300, the TV control microprocessor 240 outputs a VCR control signal VCS corresponding to the code information. At this time, the remote control transmitter 100 outputs code information which distinguishes between the TV control signal and the VCR control signal. Accordingly, it is possible to determine whether the code information received in the TV control microprocessor 240 is the TV control signal or the VCR control signal, by analyzing the code information.

Figure 5E:
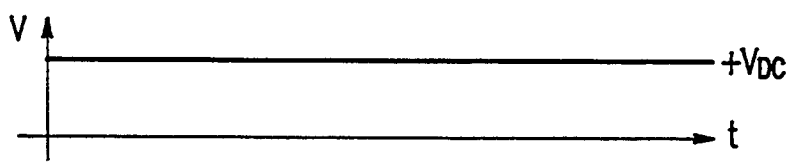

If the remote control receiving unit 230 has received the code information for controlling the VCR 300, the TV control microprocessor 240 outputs a VCR control signal VCS shown in FIG. 5E at its one selected output port, according to the analyzed code information. The VCR control signal VCS outputted from the microprocessor 240 is then converted into a signal with a predetermined voltage level, in the control signal converting unit 250.

That is, although the voltage level of VCR control signal VCS is constant, respective combined resistances determined by respective combinations of primary resistors Ra1 to Ran and secondary resistors Rb1 to Rbn-1 are different from one another, for respective output ports P1 to Pn of the TV control microprocessor 240. The operational amplifier OP11 amplifies the voltage level of VCR control signal VCS, according to the voltage amplifying gain determined by the selected combined resistance and the resistance of resistor R17 and outputs a predetermined DC voltage $V_{DC}$ shown in FIG. 5F.

Figure 5F:
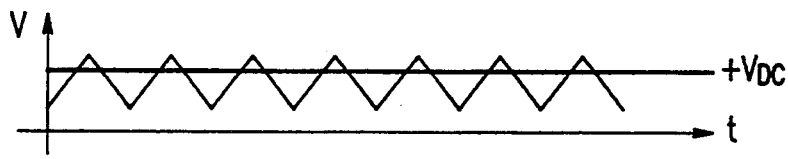
Figure 5G:
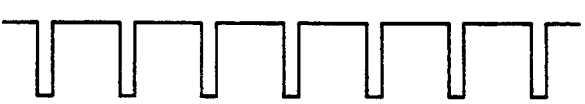
Figure 5H:
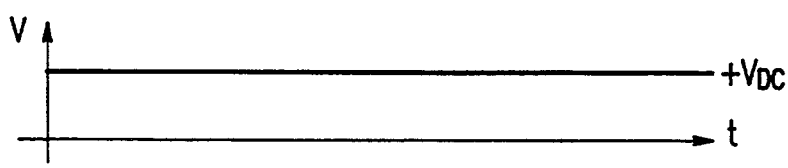

Subsequently, the output from the operational amplifier OP11 is applied to the non-inverting input of the comparator CP11 and then compared with a triangular wave outputted from the triangular wave generator 261 and shown in FIG. 5F. By the comparison, the comparator CP11 generates a pulse width modulated VCR control signal shown in FIG. 5G, which signal is applied to the control signal processing unit 310 of the VCR 300, via the radio frequency cable RFC.

During the transmission of the pulse width modulated signal, a noise signal may be mixed in the VCR control signal, via the radio frequency cable RFC. To remove a possible noise component from the VCR control signal, the band-pass filter 350 allows the passage of only a signal having a frequency band (e.g. 300 Hz) predetermined with respect to the TV system 200.

Figure 5I:

Thereafter, the pulse width modulated signal transmitted as above passes diodes D11 and D12, the condenser C21 and the resistor R23 of the rectifier 360, in turn, and is rectified so that the original VCR control signal VCS is recovered therefrom. The VCR control signal VCS is applied to the A/D converter 370 which, in turn, generates original code information shown in FIG. 5I, based on the level of the applied VCR control signal VCS.

The VCR control microprocessor 340 decodes the code information outputted from the A/D converter 370 and controls the VCR driving system, so as to carry out a function which the user requires.

As apparent from the above description, the present invention provides a convenience, in that where several terminal units are operatively connected to a single main unit, the main unit can be controlled by the terminal units.

What is claimed is:

1. A remote control circuit comprising:
   a TV system including,
      remote control receiving means for receiving and processing a remote control signal from a remote control transmitter,
      TV control microprocessor means for analyzing the remote control signal from the remote control receiving means so as to control said TV system and separate a VCR remote control signal from the remote control signal,
      VCR remote control signal transmitting means for modulating the pulse width of the VCR remote control signal separated by said TV control microprocessor means and transmitting the modulated VCR remote control signal to a VCR system, via a radio frequency cable; a VCR system including,
      remote control signal processing means for receiving and processing the VCR remote control signal from said TV control microprocessor means, and VCR control microprocessor means for controlling the VCR system based on the VCR remote control signal from said remote control signal processing means and a control signal input from a remote control signal receiver from the VCR system, said remote control signal processing unit including, a band-pass filter for filtering the VCR remote control signal input from the TV system via the radio frequency cable, a rectifier for rectifying an output signal from the band-pass filter, and an A/D converter for converting an output signal from the rectifier into a digital signal.

2. The circuit of claim 1, wherein said VCR remote control signal transmitter includes, a control signal converting unit for converting the VCR remote control signal from said TV control microprocessor means into a voltage level signal and a pulse width modulator for comparing an output signal from the control signal converting unit with a reference triangular wave signal from a triangular wave generator so as to modulate a pulse width of the output signal from the control signal converting unit and transmitting the modulated signal to the VCR system via the radio frequency cable.

* * * * *